United States Patent
Teshiba et al.

(10) Patent No.: US 10,541,461 B2
(45) Date of Patent: Jan. 21, 2020

(54) TILE FOR AN ACTIVE ELECTRONICALLY SCANNED ARRAY (AESA)

(71) Applicant: Raytheon Company, Waltham, MA (US)

(72) Inventors: Mary A. Teshiba, Torrance, CA (US); Jason G. Milne, Hawthorne, CA (US); Kevin C. Rolston, Westchester, CA (US); John J. Drab, Santa Barbara, CA (US)

(73) Assignee: Ratheon Company, Waltham, MA (US)

( * ) Notice: Subject to any disclaimer, the term of this patent is extended or adjusted under 35 U.S.C. 154(b) by 23 days.

(21) Appl. No.: 15/381,286

(22) Filed: Dec. 16, 2016

(65) Prior Publication Data
US 2018/0175476 A1 Jun. 21, 2018

(51) Int. Cl.
| | |
|---|---|
| *H01Q 1/02* | (2006.01) |
| *H01L 25/18* | (2006.01) |
| *H01L 23/66* | (2006.01) |
| *H01L 23/00* | (2006.01) |
| *H01L 23/367* | (2006.01) |
| *H01L 23/552* | (2006.01) |
| *H01Q 1/52* | (2006.01) |

(Continued)

(52) U.S. Cl.
CPC ............ *H01Q 1/02* (2013.01); *H01L 23/367* (2013.01); *H01L 23/552* (2013.01); *H01L 23/66* (2013.01); *H01L 24/29* (2013.01); *H01L 24/32* (2013.01); *H01L 25/18* (2013.01); *H01Q 1/526* (2013.01); *H01Q 21/0025* (2013.01); *H01L 2223/6622* (2013.01); *H01L 2223/6627* (2013.01); *H01L 2223/6672* (2013.01); *H01L 2223/6677* (2013.01); *H01Q 3/36* (2013.01); *H01Q 21/0075* (2013.01)

(58) Field of Classification Search
CPC .................... H01Q 21/0025; H01Q 21/0075
See application file for complete search history.

(56) References Cited

U.S. PATENT DOCUMENTS

| | | |
|---|---|---|
| 2,015,028 A | 9/1935 | Gillete |
| 3,528,050 A | 9/1970 | Hindenburg |

(Continued)

FOREIGN PATENT DOCUMENTS

| | | |
|---|---|---|
| CN | 103247581 A | 8/2013 |
| CN | 204857954 U | 12/2015 |

(Continued)

OTHER PUBLICATIONS

Response to U.S. Non-Final Office Action dated May 18, 2017 for U.S. Appl. No. 14/881,582, filed Jun. 5, 2017; 7 Pages.

(Continued)

*Primary Examiner* — Ricardo I Magallanes
(74) *Attorney, Agent, or Firm* — Daly, Crowley, Mofford & Durkee, LLP (57) ABSTRACT

In one aspect, an active electronically scanned array (AESA) tile includes a radiator structure and oxide-bonded semiconductor wafers attached to the radiator structure and comprising a radio frequency (RF) manifold and a beam former. An RF signal path through the oxide-bonded wafers comprises a first portion that propagates toward the beam former and a second portion that propagates parallel to the beam former.

19 Claims, 5 Drawing Sheets

(51) Int. Cl.
*H01Q 21/00* (2006.01)
*H01Q 3/36* (2006.01)

(56) References Cited

U.S. PATENT DOCUMENTS

| | | | |
|---|---|---|---|
| 4,690,471 A | 9/1987 | Marabotto et al. | |
| 5,172,082 A | 12/1992 | Livingston et al. | |
| 5,410,281 A | 4/1995 | Blum | |
| 5,434,575 A | 7/1995 | Jelinek et al. | |
| 5,453,751 A | 9/1995 | Tsukamoto et al. | |
| 5,455,546 A | 10/1995 | Frederick et al. | |
| 5,603,620 A | 2/1997 | Hinze et al. | |
| 5,644,277 A | 7/1997 | Gulick et al. | |
| 5,745,079 A | 4/1998 | Wang et al. | |
| 5,880,694 A | 3/1999 | Wang et al. | |
| 5,886,590 A | 3/1999 | Quan et al. | |
| 5,995,047 A | 11/1999 | Freyssinier et al. | |
| 6,100,775 A | 8/2000 | Wen | |
| 6,114,997 A | 9/2000 | Lee et al. | |
| 6,147,648 A | 11/2000 | Granholm et al. | |
| 6,184,832 B1 | 2/2001 | Geyh et al. | |
| 6,320,542 B1 | 11/2001 | Yamamoto et al. | |
| 6,429,816 B1 | 8/2002 | Whybrew et al. | |
| 6,459,415 B1 | 10/2002 | Pachal et al. | |
| 6,512,487 B1 | 1/2003 | Taylor et al. | |
| 6,664,867 B1 | 12/2003 | Chen | |
| 6,686,885 B1 | 2/2004 | Barkdoll et al. | |
| 6,856,297 B1 | 2/2005 | Durham et al. | |
| 6,867,742 B1 | 3/2005 | Irion et al. | |
| 6,876,336 B2 | 4/2005 | Croswell et al. | |
| 6,882,247 B2 | 4/2005 | Allison et al. | |
| 6,935,866 B2 | 8/2005 | Kerekes et al. | |
| 6,977,623 B2 | 12/2005 | Durham et al. | |
| 7,012,572 B1 | 3/2006 | Schaffner et al. | |
| 7,084,827 B1 | 8/2006 | Strange et al. | |
| 7,113,142 B2 | 9/2006 | McCarville et al. | |
| 7,132,990 B2 | 11/2006 | Stenger et al. | |
| 7,138,952 B2 | 11/2006 | Mcgrath et al. | |
| 7,193,390 B2 | 3/2007 | Shimoda | |
| 7,221,322 B1 | 5/2007 | Durham et al. | |
| 7,272,880 B1 | 9/2007 | Pluymers et al. | |
| 7,315,288 B2 | 1/2008 | Livingston et al. | |
| 7,358,921 B2 | 4/2008 | Snyder et al. | |
| 7,411,472 B1 | 8/2008 | West et al. | |
| 7,414,590 B2 | 8/2008 | Bij De Vaate et al. | |
| 7,688,265 B2 | 3/2010 | Irion et al. | |
| 7,948,441 B2 | 5/2011 | Irion et al. | |
| 8,035,992 B2 | 10/2011 | Kushta et al. | |
| 8,325,093 B2 | 12/2012 | Holland et al. | |
| 8,753,145 B2 | 6/2014 | Lang et al. | |
| 9,136,572 B2 | 9/2015 | Carr et al. | |
| 9,402,301 B2 | 7/2016 | Paine et al. | |
| 9,437,929 B2 | 9/2016 | Isom et al. | |
| 9,490,519 B2 | 11/2016 | Lilly et al. | |
| 9,537,208 B2 | 1/2017 | Isom | |
| 2003/0020654 A1 | 1/2003 | Navarro et al. | |
| 2003/0112200 A1 | 6/2003 | Marino | |
| 2003/0184476 A1 | 10/2003 | Sikina et al. | |
| 2005/0007286 A1 | 1/2005 | Trott et al. | |
| 2005/0156802 A1 | 7/2005 | Livingston et al. | |
| 2006/0097947 A1 | 5/2006 | McCarville et al. | |
| 2008/0036665 A1 | 2/2008 | Schadler | |
| 2008/0150832 A1* | 6/2008 | Ingram | H01Q 3/26 343/893 |
| 2008/0169992 A1 | 7/2008 | Ortiz et al. | |
| 2009/0073075 A1 | 3/2009 | Irion et al. | |
| 2009/0091506 A1 | 4/2009 | Navarro et al. | |
| 2009/0121967 A1 | 5/2009 | Cunningham | |
| 2010/0164783 A1* | 7/2010 | Choudhury | H01Q 3/26 342/175 |
| 2011/0089531 A1 | 4/2011 | Hillman et al. | |
| 2012/0034820 A1 | 2/2012 | Lang et al. | |
| 2012/0068906 A1 | 3/2012 | Asher et al. | |
| 2012/0098706 A1 | 4/2012 | Lin et al. | |
| 2012/0146869 A1 | 6/2012 | Holland et al. | |
| 2012/0212386 A1 | 8/2012 | Massie et al. | |
| 2012/0287581 A1 | 11/2012 | Sauerbier et al. | |
| 2012/0306698 A1 | 12/2012 | Warnick et al. | |
| 2012/0313818 A1 | 12/2012 | Puzella et al. | |
| 2013/0026586 A1 | 1/2013 | Seok et al. | |
| 2013/0050055 A1 | 2/2013 | Paradiso et al. | |
| 2013/0175078 A1 | 7/2013 | Pai | |
| 2013/0187830 A1 | 7/2013 | Warnick et al. | |
| 2013/0194754 A1 | 8/2013 | Jung et al. | |
| 2013/0207274 A1 | 8/2013 | Liu et al. | |
| 2013/0314292 A1 | 11/2013 | Maley | |
| 2014/0132473 A1 | 5/2014 | Isom | |
| 2014/0264759 A1* | 9/2014 | Koontz | H01L 23/46 257/618 |
| 2015/0015453 A1* | 1/2015 | Puzella | H01Q 21/0025 343/853 |
| 2015/0200460 A1 | 7/2015 | Isom et al. | |
| 2015/0353348 A1* | 12/2015 | Vandemeer | B81B 7/0006 257/415 |
| 2016/0172755 A1* | 6/2016 | Chen | H01Q 21/0025 342/371 |
| 2016/0352023 A1 | 12/2016 | Dang et al. | |
| 2018/0040955 A1 | 2/2018 | Vouvakis et al. | |
| 2018/0090851 A1 | 3/2018 | Feldman et al. | |
| 2018/0337461 A1 | 11/2018 | Kildal et al. | |
| 2019/0044234 A1 | 2/2019 | Isom | |

FOREIGN PATENT DOCUMENTS

| | | |
|---|---|---|
| EP | 1 970 952 A2 | 9/2008 |
| EP | 1 970 952 A3 | 9/2008 |
| JP | U-1992027609 | 3/1992 |
| JP | H07-106841 | 4/1995 |
| JP | 2000-312112 A | 11/2000 |
| JP | 2006504375 A | 2/2006 |
| JP | 6195935 B2 | 9/2017 |
| TW | 2014-03765 A | 1/2014 |
| TW | 2014-34203 A | 9/2014 |
| TW | 2016-05017 A | 2/2016 |
| WO | WO 2009/077791 A1 | 6/2009 |
| WO | WO 2014/168669 A1 | 10/2014 |
| WO | WO 2015/006293 A1 | 1/2015 |
| WO | WO 2016/138267 A1 | 9/2016 |
| WO | WO 2016/138267 A8 | 9/2016 |

OTHER PUBLICATIONS

PCT International Search Report and Written Opinion dated Dec. 8, 2017 for International Application No. PCT/US2017/054836; 15 Pages.
PCT International Search Report and Written Opinion dated Jan. 3, 2018 for International Application No. PCT/US2017/055059; 17 Pages.
PCT International Search Report and Written Opinion dated Jan. 3, 2018 for International Application No. PCT/US2017/055222; 16 Pages.
Luo et al.; "Meander Line Coupled Cavity-Backed Slot Antenna for Broadband Circular Polarization"; IEEE Antennas and Wireless Propagation Letters; vol. 14; Feb. 2, 2015; 4 Pages.
U.S. Non-Final Office Action dated Apr. 5, 2018 for U.S. Appl. No. 15/379,761; 20 pages.
U.S. Non-Final Office Action dated Apr. 5, 2018 for U.S. Appl. No. 15/379,775; 16 pages.
Japanese Office Action dated Feb. 28, 2017 for Japanese Pat. App. No. 2015-541757 with English Translations; 4 Pages.
U.S. Appl. No. 14/881,582, dated Oct. 2015, Viscarra et al.
Non-Final Office Action dated Jun. 8, 2015 for U.S. Appl. No. 13/674,547; 23 pages.
Response to Office Action dated Jun. 8, 2015 for U.S. Appl. No. 13/674,547, filed Aug. 8, 2015; 18 pages.
U.S. Final Office Action dated Dec. 3, 2015 for U.S. Appl. No. 13/674,547; 22 Pages.
Non-Final Office Action dated Apr. 7, 2016 for U.S. Appl. No. 13/674,547; 27 Pages.

(56) References Cited

OTHER PUBLICATIONS

Response to Final Office Action dated Dec. 3, 2015 for U.S. Appl. No. 13/674,547, filed Feb. 22, 2016; 16 Pages.
Response to Office Action dated Apr. 7, 2016 for U.S. Appl. No. 13/674,547, filed Jun. 21, 2016; 16 Pages.
U.S. Final Office Action dated Jul. 1, 2016 for U.S. Appl. No. 13/674,547; 30 Pages.
Response to U.S Final Office Action dated Jul. 1, 2016 for U.S. Appl. No. 13/674,547, filed Aug. 18, 2016; 14 Pages.
Notice of Allowance dated Sep. 16, 2016 for U.S. Appl. No. 13/674,547; 17 Pages.
PCT International Search Report and Written Opinion for PCT/US2013/038408 dated Jun. 28, 2013; 14 Pages.
PCT International Preliminary Report on Patentability for PCT/US2013/038408 dated May 21, 2015; 9 Pages.
European 161/162 Communication for Application No. 13721516.6 dated Jul. 9, 2015; 2 Pages.
Response (with Amended Claims) to European 161/162 Communication dated Jul. 9, 2015, for Application No. 1372156.6: Response filed on Jan. 19, 2016; 34 Pages.
Korean Office Action (with English Translation) dated Feb. 27, 2016 for Application No. 10-2015-7010618; 4 Pages.
Response (with Foreign Associate Reporting Letter) to Korean Office Action dated Feb. 27, 2016 for Application No. 10-2015-7010618; Response filed on Apr. 27, 2016; 15 Pages.
Japanese Office Action (with English Translation) dated Jun. 21, 2016 for Application No. 2015-541757; 8 Pages.
Response (with Foreign Associate Reporting Letter) to Japanese Office Action dated Jun. 21, 2016, for Application No. 2015-2015-541757; Response filed on Sep. 21, 2016; 7 Pages.
PCT International Search Report and Written Opinion for PCT/US2016/034045 dated Aug. 30, 2016; 11 Pages.
Hotte et al., "Directive and high-efficiency slotted waveguide antenna array for V-band made by wire electrical discharge machining;" Electronic Letter vol. 51, No. 5; Mar. 5, 2015 ; 2 Pages.
Kasemodel et al., "Broadband Array Antenna Enhancement With Spatially Engineered Dielectrics;" U.S. Appl. No. 13/590,769, filed Aug. 21, 2012; 19 Pages.
Kasemodel et al., "Broadband Planar Wide-Scan Array Employing Tightly Coupled Elements and Integrated Balun;" Proceedings of the 2010 IEEE International Symposium on Phased Array Systems and Technology; Oct. 12-15, 2010; 6 Pages.
Kindt et al., "Polarization Correction in Dual-Polarized Phased Arrays of Flared Notches;" Proceedings of the 2011 IEEE International Symposium on Antennas and Propagation (APSURSI); Jul. 3-8, 2011; 4 Pages.
Mishra et al., "Array of SIW Resonant Slot Antenna for V Band Applications;" Proceedings of the 2013 IEEE International Conference on Microwave and Photonics (ICMAP); Dec. 13-15, 2013; 4 Pages.
Nesic et al., "Wideband Printed Antenna With Circular Polarization;" Proceedings of 1997 IEEE Antennas and Propagation Society International Symposium; Jul. 13-18, 1997; 4 Pages.
Wong et al., "Broad-Band Single-Patch Circularly Polarized Microstrip Antenna with Dual Capacitively Coupled Feeds;" Proceedings of the 2001 IEEE Transactions on Antennas and Propagation, vol. 49, No. 1; Jan. 2001; 4 Pages.
Wong et al., "Design of Dual-Polarized L-Probe Patch Antenna Arrays with High Isolation;" Proceedings of 2004 IEEE Transactions on Antennas and Propagation, vol. 50, No. 1; Jan. 2004; 8 Pages.
Wu et al., "A Wideband High-Gain High-Efficiency Hybrid Integrated Plate Array Antenna for V-Band Inter-Satellite Links;" Proceedings of 2015 IEEE Transactions on Antennas and Propagation, vol. 63, No. 4; Apr. 2015; 9 Pages.
PCT International Preliminary Report and Written Opinion dated Apr. 26, 2018 for International Application No. PCT/US2016/034045; 8 Pages.
U.S. Non-Final Office Action dated May 18, 2017 for U.S. Appl. No. 14/881,582; 21 Pages.
Notice of Allowance dated Jun. 23, 2017 for U.S. Appl. No. 14/881,582; 8 Pages.
Response to U.S. Non-Final Office Action dated Apr. 5, 2018 for U.S. Appl. No. 15/379,761, filed Aug. 1, 2018; 23 Pages.
Response to U.S. Non-Final Office Action dated Apr. 5, 2018 for U.S. Appl. No. 15/379,775, filed Aug. 1, 2018; 17 Pages.
Response (with English Translation of Response, Current Claims and Amended Specification) to Taiwan Office Action dated Jun. 19, 2018 for Taiwan Application No. 106135418; Response filed on Sep. 12, 2018; 40 Pages.
U.S. Final Office Action dated Sep. 14, 2018 for U.S. Appl. No. 15/379,761; 20 Pages.
U.S. Final Office Action dated Sep. 21, 2018 for U.S. Appl. No. 15/379,775; 19 Pages.
Taiwan Office Action (with Search Report) dated Jun. 19, 2018 for Taiwan Application No. 106135418; 18 pages.
Taiwan Examination Report (with English Translation) dated Oct. 31, 2018 for Taiwan Application No. 106135617; 23 Pages.
Taiwan Examination Report (with English Translation) dated Nov. 2, 2018 for Taiwan Application No. 106135613; 20 Pages.
Response to U.S. Final Office Action dated Sep. 14, 2018 for U.S. Appl. No. 15/379,761, filed Dec. 14, 2018; 11 Pages.
Response to U.S. Final Office Action dated Sep. 21, 2018 for U.S. Appl. No. 15/379,775, filed Dec. 21, 2018; 13 Pages.
Taiwan Examination Report (with English Translation) dated Nov. 26, 2018 for Taiwan Application No. 106135418; 8 Pages.
U.S. Non-Final Office Action dated Jan. 11, 2019 for U.S. Appl. No. 15/379,761; 20 Pages.
U.S. Non-Final Office Action dated Jan. 14, 2019 for U.S. Appl. No. 15/379,775; 22 Pages.
Response (with English Translation, Claims and Specification) to Taiwan Examination Report dated Oct. 31, 2018 for Taiwan Application No. 106135617; Response filed Jan. 7, 2019; 22 Pages.
Response (with English Translation and Specification) to Taiwan Examination Report dated Nov. 2, 2018 for Taiwan Application No. 106135613; Response filed Jan. 8, 2019; 9 Pages.
Taiwan Statement of Reasons for Re-Examination (with Reporting Letter dated Jan. 8, 2019 and English Translation) dated Jan. 8, 2019 for Taiwan Application No. 106135418; 7 Pages.
Chang-Chien et al., "MMIC Compatible Wafer-Level Packaging Technology;" Proceedings of the International Conference on Indium Phosphide and Related Materials ($19^{th}$ IPRM); May 14-18, 2007; 4 Pages.
Chang-Chien et al., "MMIC Packaging and Heterogeneous Integration Using Wafer-Scale Assembly;" Proceedings of the CS MANTECH Conference; May 14-17, 2007; 4 Pages.
Chang-Chien, "Wafer-Level Packaging and Wafer-Scale Assembly Technologies;" Presentation by Northrop Grumman Aerospace Systems (NGAS); Proceedings of the CS MANTECH Workshop 6; May 17, 2010; 43 Pages.
Green, "DARPA's Heterogeneous Integration Vision and Progress on Modular Design;" Presentation by DARPA; Proceedings of the 3D Architectures for Semiconductor Integration and Packaging Conference (ASIP); Dec. 17, 2015; 17 Pages.
Gu et al., "W-Band Scalable Phased Arrays for Imaging and Communications;" Integrated Circuits for Communications, IEEE Communications Magazine; Apr. 2015; 9 Pages.
Popovic, "Micro-coaxial Micro-fabricated Feeds for Phased Array Antennas;" Proceedings of the 2010 IEEE International Symposium on Phased Array Systems and Technology (ARRAY); Oct. 12-15, 2010; 10 Pages.
Shin et al., "A 108-114 GHz 4x4 Wafer-Scale Phased Array Transmitter with High-Efficiency On-Chip Antennas;" IEEE Journal of Solid-State Circuits, vol. 48, No. 9; Sep. 2013; 15 Pages.
Urteaga, "3D Heterogeneous Integration of III-V Devices and Si CMOS;" Presentation by Teledyne Scientific Company; Proceedings of the 3D Architectures for Semiconductor Integration and Packaging Conference (ASIP); Dec. 17, 2015; 26 Pages.
Zihir et al., "A 60 GHz 64-element Wafer-Scale Phased-Array with Full-Reticle Design;" Proceedings of the 2015 IEEE MTT-S International Microwave Symposium; May 17-22, 2015; 3 Pages.
Japanese Final Office Action (with English Translation) dated Feb. 28, 2017 for Japanese Application No. 2015-541757; 4 Pages.

(56) References Cited

OTHER PUBLICATIONS

European Examination Report dated Jun. 21, 2018 for European Application No. 13721516.6; 6 Pages.
Response to European Examination Report dated Jun. 21, 2018 for European Application No. 13721516.6; Response filed Oct. 26, 2018; 16 Pages.
U.S. Non-Final Office Action dated Oct. 9, 2018 for U.S. Appl. No. 15/731,906; 13 Pages.
Response to U.S. Non-Final Office Action dated Oct. 9, 2018 for U.S. Appl. No. 15/731,906, filed Nov. 16, 2018; 12 Pages.
U.S. Notice of Allowance dated Dec. 14, 2018 for U.S. Appl. No. 15/731,906; 9 Pages.
PCT International Search Report dated Apr. 26, 2018 for International Application No. PCT/US2018/015421; 15 Pages.
Tong et al., "Novel Sequential Rotation Technique for Broadband Circularly Polarized Microstrip Ring Anennas;" Proceedings of the 2008 Loughborough Antennas & Propagation Conference; Mar. 17, 2008; 4 Pages.
Taiwan Allowance Decision (with English Translation) dated Mar. 20, 2019 for Taiwan Application No. 106135613; 4 Pages.
U.S. Notice of Allowance dated Apr. 4, 2019 for U.S. Appl. No. 15/731,906; 5 Pages.
Response to U.S. Non-Final Office Action dated Jan. 14, 2019 for U.S. Appl. No. 15/379,775, filed Apr. 25, 2019; 10 Pages.
Response to U.S. Non-Final Office Action dated Jan. 11, 2019 for U.S. Appl. No. 15/379,761, filed May 13, 2019; 14 Pages.
Taiwan Examination Report and Search Report (with English Translation) dated Apr. 15, 2019 for Taiwan Application No. 106135617; 21 Pages.
PCT International Preliminary Report dated Jun. 27, 2019 for International Application No. PCT/US2017/055059; 13 Pages.
PCT International Preliminary Report dated Jun. 27, 2019 for International Application No. PCT/US2017/055222; 9 Pages.
Response (with Machine English Translation from Google Translator) to Taiwan Examination Report dated Apr. 15, 2019 for Taiwan Application No. 106135617; Response filed Jul. 4, 2019; 18 Pages.
PCT International Preliminary Report dated Jun. 27, 2019 for International Application No. PCT/US2017/054836; 9 Pages.
European Communication Pursuant to Rules 161(1) and 162 EPC dated Jul. 23, 2019 for European Application No. 17791226.8; 3 Pages.
European Communication Pursuant to Rules 161(1) and 162 EPC dated Jul. 23, 2019 for European Application No. 17784814.0; 3 Pages.
European Communication Pursuant to Rules 161(1) and 162 EPC dated Jul. 23, 2019 for European Application No. 17785128.4; 3 Pages.
Taiwan Allowance Decision (with English Translation) dated Aug. 30, 2019 for Taiwan Application No. 106135617; 4 Pages.
European Examination Report dated Sep. 9, 2019 for European Application No. 13721516.6; 4 Pages.
Taiwan Office Action (with English Translation) dated Sep. 20, 2019 for Taiwan Application No. 106135418; 14 Pages.

* cited by examiner

TILE FOR AN ACTIVE ELECTRONICALLY SCANNED ARRAY (AESA)

BACKGROUND

As is known in the art, a phased array antenna includes a plurality of active circuits spaced apart from each other by known distances. Each of the active circuits is coupled through a plurality of phase shifter circuits, amplifier circuits and/or other circuits to either or both of a transmitter and receiver. In some cases, the phase shifter, amplifier circuits and other circuits (e.g., mixer circuits) are provided in a so-called transmit/receive (T/R) module and are considered to be part of the transmitter and/or receiver.

The phase shifters, amplifier and other circuits (e.g., T/R modules) often require an external power supply (e.g., a DC power supply) to operate correctly. Thus, the circuits are referred to as "active circuits" or "active components." Accordingly, phased array antennas which include active circuits are often referred to as "active phased arrays." An active phased array radar is also known as an active electronically scanned array (AESA).

Active circuits dissipate power in the form of heat. High amounts of heat can cause active circuits to be inoperable. Thus, active phased arrays should be cooled. In one example heat-sink(s) are attached to each active circuit to dissipate the heat.

SUMMARY

In one aspect, an active electronically scanned array (AESA) tile includes a radiator structure and oxide-bonded semiconductor wafers attached to the radiator structure and comprising a radio frequency (RF) manifold and a beam former. An RF signal path through the oxide-bonded wafers comprises a first portion that propagates toward the beam former and a second portion that propagates parallel to the beam former.

The aspect above may have one or more of the following features. The RF signal path through the oxide-bonded wafers may include a third portion that propagates away from the beam former. The RF signal path further may include a third path that extends into the beam former and out of the beam former. The oxide-bonded wafers may be fused silica. The oxide-bonded wafers may include metal posts wherein a metal post from one wafer may be connected to a metal post of another wafer. The beam former may include at least one of a phase shifter, an amplifier or an application-specific integrated circuit (ASIC). The beam former may be fabricated on silicon germanium (SiGe) wafer. The radiator structure may provide radiation shielding for the beam former. The RF manifold may propagate RF signals and not propagate any DC signals. The beam former may include a redistribution layer to allow for surface mounting to a printed circuit board. Power, signal and RF may be routed from the PWB through the beam former by a wafer via. The oxide-bonded semiconductor wafers may be made of high resistivity silicon. The RF signal may be routed using at least one of a stripline, a coplanar waveguide (CPW), a buried microstrip and a coaxial RF structure. The tile may include time delay structures and filtering structures. Active element spacing fits within Lambda/2 to enable wide scan to 60 degrees. The number of active elements between sixteen to sixty-four active elements. The tiles are scalable to an N×N array of active elements where N>1.

DETAILED DESCRIPTION

Described herein is a millimeter-wave radio frequency (RF) tile used as an active electronically scanned array (AESA) and scalable to form larger N×N AESA, for example. The tile, as described herein, incorporates a low loss glass RF manifold that is wafer level bonded directly to the beamforming circuit and a radiation shielding radiator.

As is understood in the art, higher frequencies require tighter lattice spacing between the active elements, which leaves less room for the active circuitry. This becomes even tighter when lambda/2 (half wavelength at transmitted frequency) spacing is required for a wide scan angle. The tile structures described herein enable signals to traverse a Z-axis using vias, for example, thereby allowing for higher frequencies such as Ka band and above to be achieved. One or more tiles may be mounted to a printed circuit board, which enables scalability. For example, the tile provides high density RF packaging and interconnects. In one example, the tile includes an RF-only manifold in a low-loss fused silica. In one example, the tile provides beam former functionality in silicon germanium (SiGe) and the SiGe beam former may be placed in close proximity to a coolant to provide thermal management. In one example, an RF radiator may also provide shielding of the SiGe beam former, for example, from radiation effects. In other examples, the beam former may be fabricated in other semiconductors such as high resistivity silicon, silicon carbide, gallium arsenide and so forth. In other examples, other functionality may be included in the RF manifold layer such as filtering and time delay. In one example, time delay functionality includes routing longer trace lengths to delay a signal. These other functions may be added into additional wafers incorporated in the stack.

Figure 1:
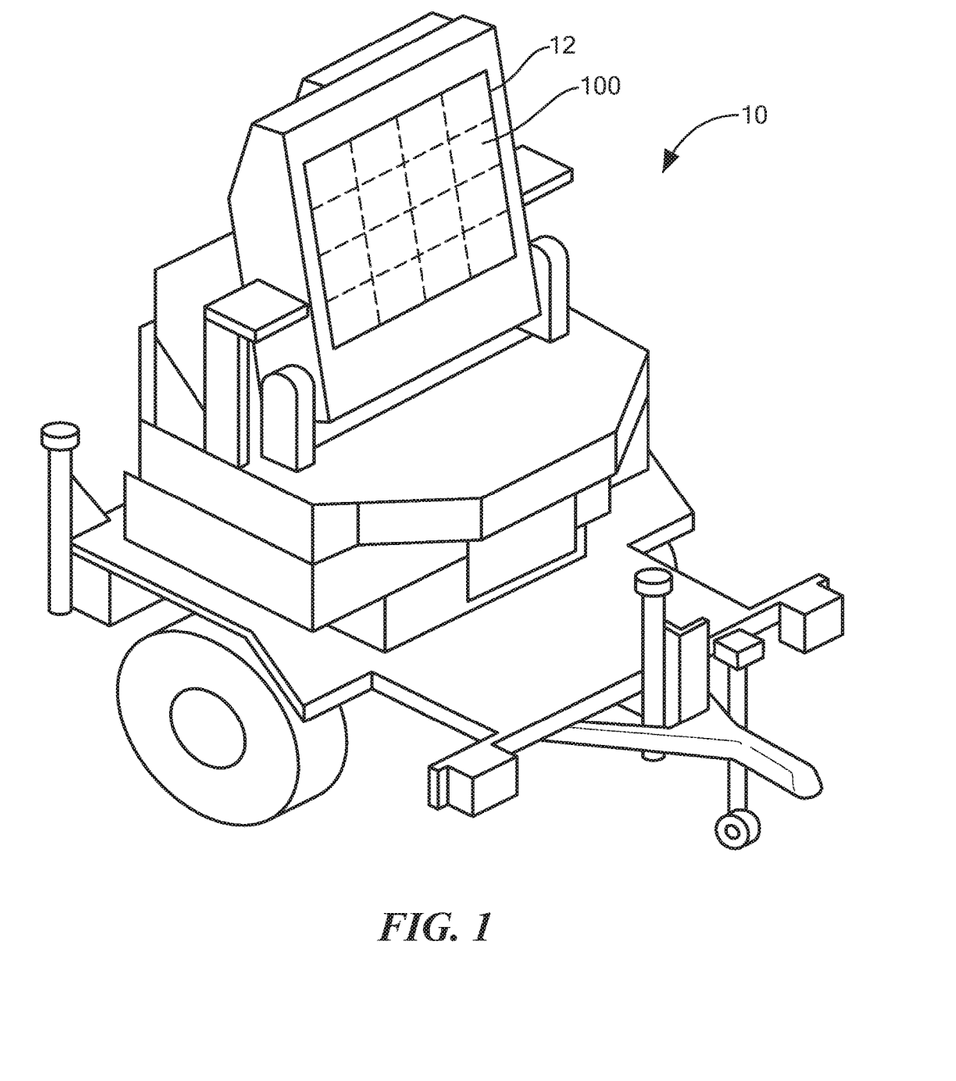
FIG. 1 is a diagram of one example of an array of active electronically scanned array (AESA) disposed on a mobile platform.

Referring to FIG. 1, an AESA may be used in a number of applications. For example, as shown in FIG. 1, an array 12 of AESA 100 may be used in a mobile environment such as in a mobile platform unit 10. In this example, the AESA 100 are arranged in a 4×4 array. Though FIG. 1 depicts AESA 100 that are in a shape of a rectangle, the AESA 100 may be constructed to be a circle, triangle or any polygon shape. Also, though the array 12 is in a shape of a square the array may be a rectangle, circle, triangle or any polygon arrangement. Further, the number of AESA 100 may be one to any number of AESA 100.

In other applications, one or more AESA 100 may be used on the side of naval vessels, on ground structures, ground vessels, air vessels, space vessels and so forth. In one particular example, AESA 100 may be placed on a stellar or planetary probe. As will be shown herein, an AESA 100 is a "building block" for forming an AESA system that is modular and scalar. In one particular example, the AESA 100 is a millimeter-wave AESA.

Figure 2:
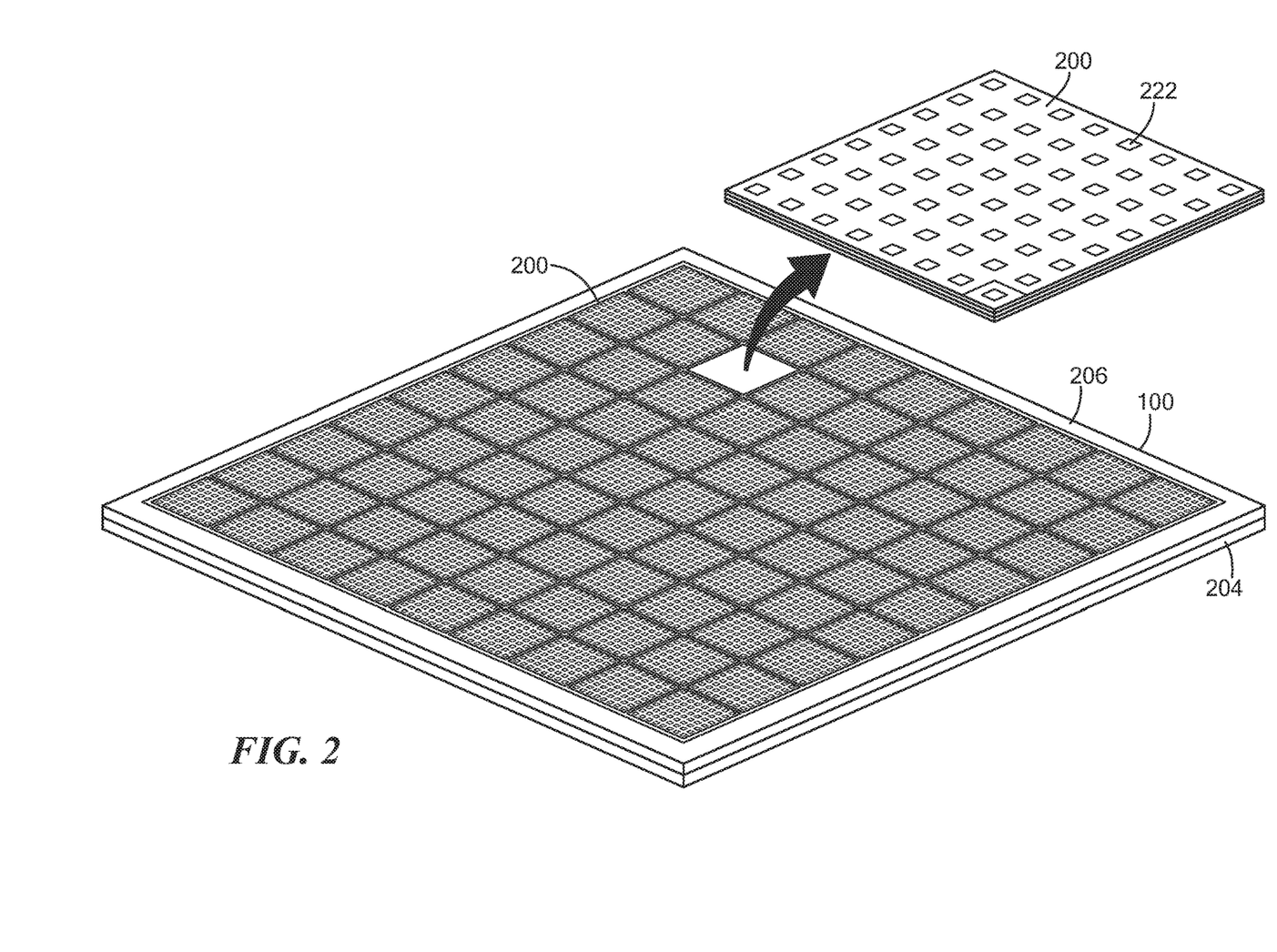
FIG. 2 is a diagram of an example of the AESA.

Referring to FIG. 2, in one particular example, the AESA 100 includes an array of tiles 200 (e.g., a 9×9 array of tiles 200). The tiles 200 are also known as "known good tiles" (KGT). The AESA 100 also includes a cooling plate 204 and a printed circuit board (PCB) 206. In one example, each tile 200 is attached to the PCB 206, which is cooled by the cold plate 204. Each tile 200 includes active elements 222 that transmit and receive signals. In one example, the active elements 222 are arranged in an 8×8 array. As will be further described herein, the tiles 200 are fabricated from a stack of oxide-bonded wafers, which are interconnected using radio frequency direct bond hybridization (RF-DBH) and through wafer vias.

Figure 3:
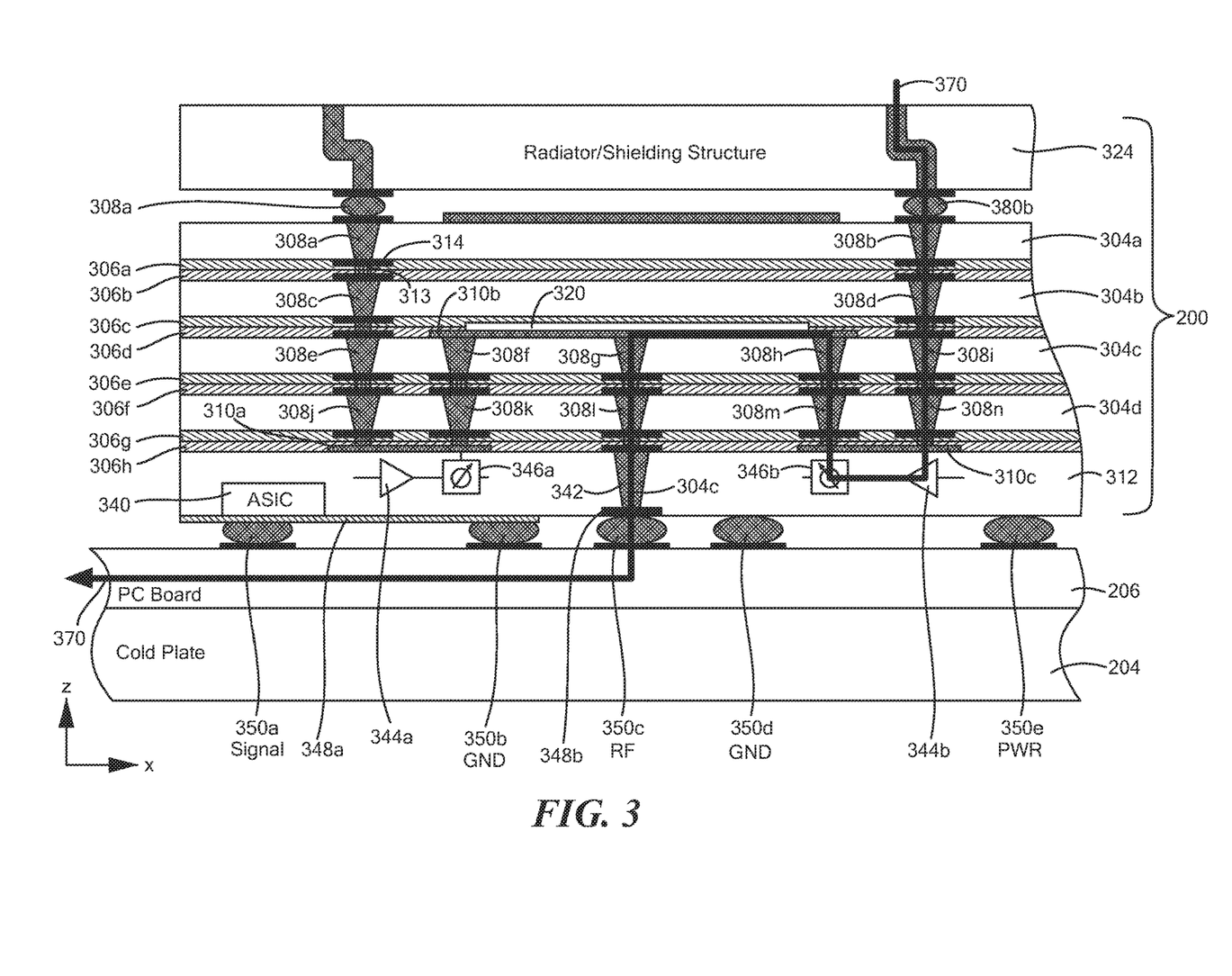
FIG. 3 is a cross-sectional view of an example of the AESA with a tile.

Referring to FIG. 3, the tile 200 includes wafers (e.g., wafers 304a, a wafer 304b, a wafer 304c and a wafer 304d), a beam former 312 and a radiator/shielding structure 324. The wafers 304a-304d are oxide bonded. For example, an oxide 306a of the wafer 304a is bonded with the oxide 306b of the wafer 304b, an oxide 306c of the wafer 304b is bonded with the oxide 306d of the wafer 304c and an oxide 306e of the wafer 304c is bonded with the oxide 306f of the wafer 304d. Oxide is also used to bond the beam former 312 to the wafer stack (e.g., an oxide 306g on the wafer 304d is bonded with an oxide 306h of the beam former 312).

An RF manifold 320 is disposed within the wafers 304a-304d. In one particular example, the RF manifold is in the middle of the wafers 304a-304d as depicted in FIG. 3, but may be located in other wafers than shown in FIG. 3. The RF manifold 320 functions as an RF combiner/divider. For example, with sixty-four active elements the manifold would be a 64:1 RF combiner/divider. In one example, within the wafers 304a-304d the manifold 320 routes only RF signals and, in particular, there is no routing of DC power or control signals in the wafers 304a-304d. The manifold 320 extends in the XY-Plane (i.e., into the FIG. 3) and an example of the manifold 320 is depicted in the XY plane in FIG. 5. In one example, the manifold 320 includes layers that are made of high resistivity silicon.

In one example, the wafers 304a-304d are fused silica wafers. In one particular example, each silica wafer is 100 microns thick. In one particular example, the fused silica is a low loss fused silica, where k=3.82 and the loss tangent is equal to 0.0007 at 60 GHz. In one example, the wafers 304a-304d may be low loss, high resistivity silicon. In further examples, wafers 304a-304d may be more or less than four wafers.

Vias are used to provide an electrical path through the tile 200. For example, the wafer 304a includes vias (e.g., a via 308a and a via 308b), the wafer 304b includes vias (e.g., a via 308c and a via 308d), the wafer 304c includes vias (e.g., a via 308e, a via 308f, a via 308g, a via 308h, and a via 308i) and the wafer 304d includes vias (e.g., a via 308j, a via 308k, a via 308l, a via 308m, and a via 308n).

Vias may be connected to metal traces which are connected to metal posts. For example, the wafer 304a includes a metal post 313 and a metal trace 314. As further described in FIG. 4, the metal posts provide electrical connectivity from one wafer to another wafer.

The oxide-bonded wafers 304a-304d include metallization layers used for electrical interconnections. In one example, metal layer 310a provides an interconnect between via 308j and via 308k. In another example, the oxide 306h includes metal layer interconnect 310b providing an electrical connection between the via 308f, the via 308g and the via 308h. In a further example, the oxide 306h includes an interconnect 310c providing an electrical connection between the via 308m and the via 308n. The via 308 connects the metal on both sides of a wafer 304 and the interconnect between metal pads on the wafer are made during oxide bonding with the metal post shown in metal post 313.

The beam former 312 includes at least one control application-specific integrated circuit ASIC (e.g., an ASIC 340), amplifiers (e.g., an amplifier 344a and an amplifier 344b) and phase shifters (e.g., a phase shifter 346a and a phase shifter 346b). In one example, the beam former 312 is fabricated on a silicon germanium (SiGe) wafer. In other examples, the beam former 312 provides RF attenuation and RF switches.

The beam former 312 also includes backside redistribution layers (RDL) (e.g., RDLs 348a) which includes interconnect pads, 348b to enable attachment to the PCB 206 using standard surface mount technology. The beam former 312 is attached to the PCB 206 by solder bumps (e.g., solder bumps 350a-350e). In one example, the solder bump 350a carries control signals, the solder bumps 350b, 350d are attached to ground, the solder bump 350c carries RF signals and the solder bump 350e carries power.

The radiator/shielding structure 324 is bonded to the wafers by a metal interconnect. In one example, the interconnect may be a solder bumps. In another example, it could be an indium bump. For example, the radiator/shielding structure 324 is bonded to the vias 308a of the wafer 304a by a solder bumps 380a and the radiator/shielding structure 324 is bonded to the vias 308b of the wafer 304a by a solder bumps 380a. In one example, the radiator/shielding structure 324 is designed to propagate an RF signal through the radiator and provide a radiation shield for the beam former 312. In one example, the radiator is made of a metal with low coefficient of expansion like invar to lessen the stress of connection to the wafer stack and thick enough to provide the correct amount of radiation shielding.

In one particular example, an RF signal path 370 starts at the radiator/shielding structure 324 and continues through connection 380b, the via 308b of the wafer 304a, through the via 308d of the wafer 304b, through the via 308i of the wafer 304c and through the via 308n of the wafer 304d. The RF signal path 370 continues in the beam former 312 by going through the amp 344b and the phase shifter 346. The RF signal path 370 continues back away from the beam former 312 and into the wafers 304c, 304d by going through the via 308m of the wafer 304d, through the via 308h of the wafer 304c. The RF signal path 370 continues through the interconnect 310b through the via 308g of the wafer 304c, through the via 308i of the wafer 304d. The RF signal path 370 propagates back into the beam former 312 and through the via 304c to the PCB 206 through bump 350c.

The RF signal path 370 moves in at least two axes within the wafers. For example, the RF signal path 370 moves along two axes (e.g., it moves along the X-axis and the Z-axis (i.e., in an X-Z plane)). In other examples, the RF signal path 370 may also move in the Y-axis (not shown in FIG. 3, but depicted in FIG. 5). In other examples, the RF signal path may flow in opposite direction to the RF signal path 370. Other RF signal paths are not limited by the RF signal path 370. That is, other RF signal paths and combinations are possible and that the RF signal path 370 is just one example of the many RF signal paths possible in FIG. 3.

Figure 4:
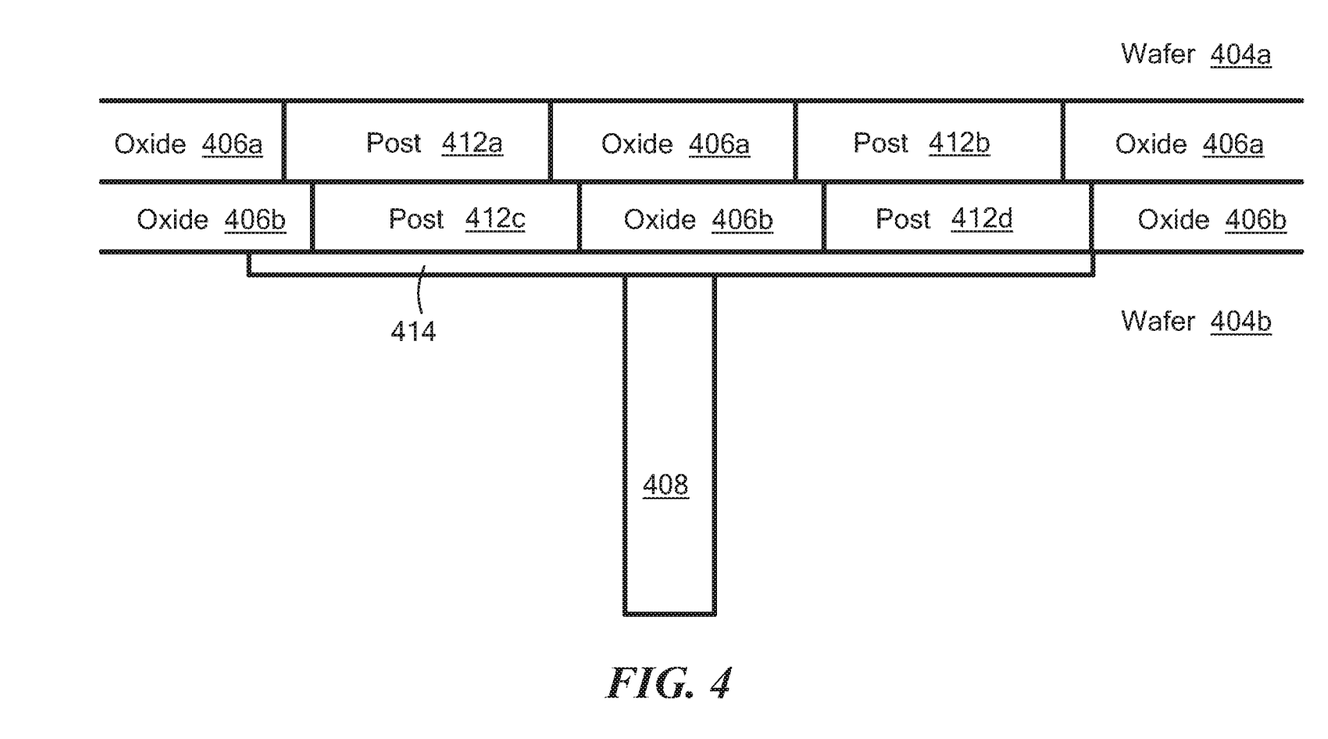
FIG. 4 is a cross-sectional view of an example of two oxide-bonded wafers.

FIG. 4 depicts one example of two wafers that are oxide bonded, for example, in a manner that the oxide-bonded wafers 304a-304d are configured. For example, an oxide 406a of a wafer 404a is bonded to an oxide 406b of a wafer 404b. In one example, the oxide bond is a molecular bond formed at room temperature. The DBH includes metal posts such as a post 412a of the wafer 404a bonded to a post 412c of the wafer 404b and a post 412b of the wafer 404a bonded to a post 412d of the wafer 404b. In one example, the posts 412a-412d are made of metal. In one particular example, the posts 412a-412d are copper posts. In another particular example, the posts 412a-412d are nickel posts. In a further particular example, the posts 412a-412d are aluminum posts. In one example the posts 412a-412d have less than 10 microns of pitch capability.

Posts may be connected by a metal trace layer (e.g., post 412c is connected to a post 412d by a metal trace layer 414). The metal trace layer may be connected to vias (e.g., the metal trace layer 414 is connected to the via 408). In one example, the via 408 may be about 25 microns in diameter. In one example, the via 408 may be a copper via.

Figure 5:
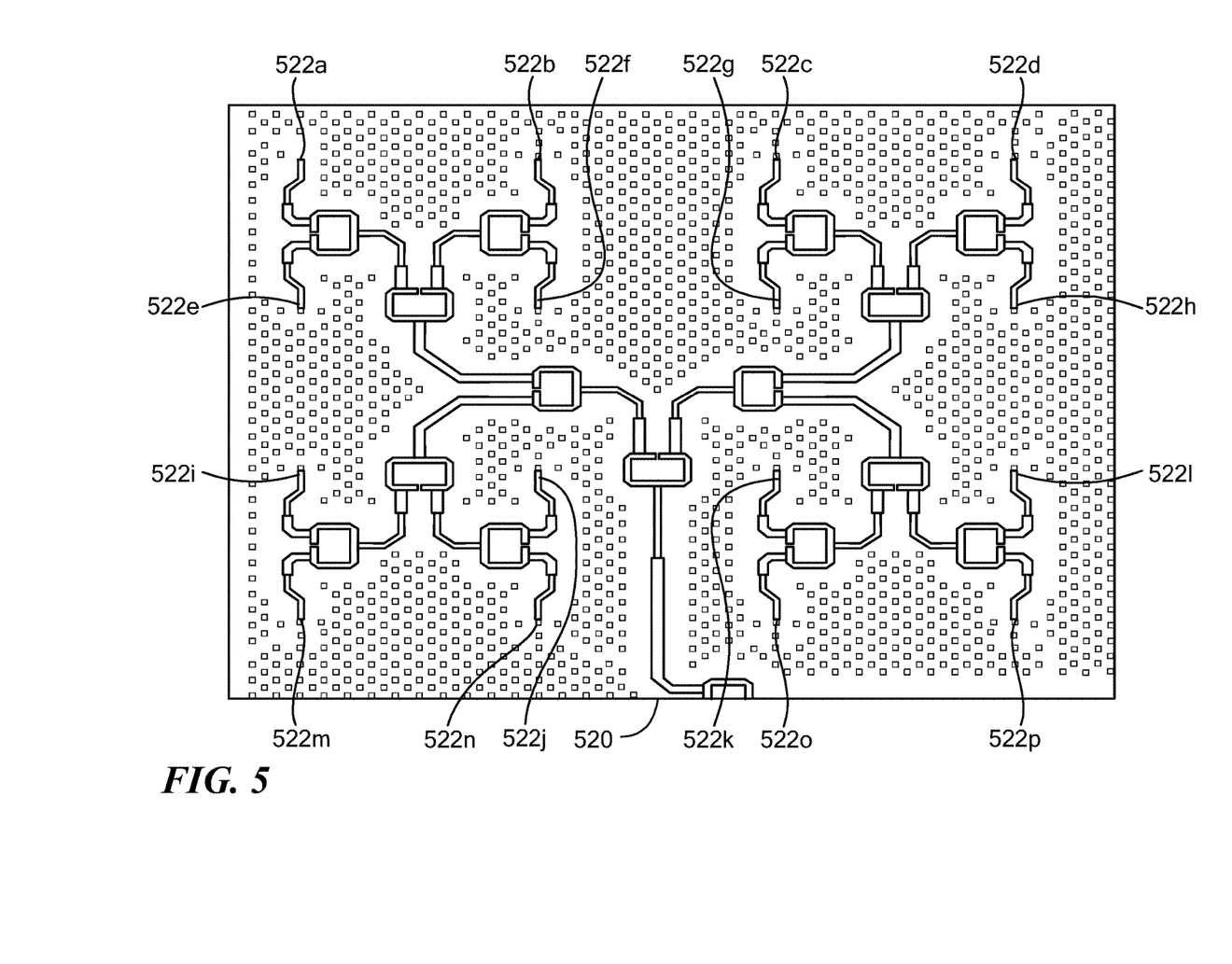
FIG. 5 is a diagram of an example of a radio frequency (RF) manifold.

FIG. 5 depicts an example of the RF manifold 320, an RF manifold 520 in an X-Y plane, for example. In this example, the RF manifold 520 is a 16:1 RF combiner/divider for sixteen elements (e.g., active elements 522a-522p). In one example, the RF manifold 520 is fabricated in wafers 304a-304d that are low loss, high resistivity silicon.

The processes described herein are not limited to the specific embodiments described. Elements of different embodiments described herein may be combined to form other embodiments not specifically set forth above. Other embodiments not specifically described herein are also within the scope of the following claims.

What is claimed is:

1. An active electronically scanned array (AESA) tile comprising:
    a radiator structure; and
    oxide-bonded semiconductor wafers attached to the radiator structure and comprising a low loss glass radio frequency (RF) manifold and a beam former, wherein the RF manifold is not in direct contact with the beam former;
    wherein an RF signal path through the oxide-bonded semiconductor wafers comprises a first portion that propagates toward the beam former, a second portion that propagates parallel to the beam former, a third portion that propagates away from the beam former, and a fourth portion that extends into the beam former and out of the beam former;
    wherein the RF signal path moves along three axes,
    wherein the first portion, the third portion and the fourth portion of the RF signal move in a Z-axis direction,
    wherein the second portion of the RF signal moves in an X-axis direction, and
    a fifth portion of the RF signal moves in a Y-axis direction.

2. The AESA tile of claim 1, wherein the oxide-bonded semiconductor wafers are fused silica.

3. The AESA tile of claim 1, wherein the oxide-bonded semiconductor wafers comprise metal posts, and
    wherein a metal post from one wafer is connected to a metal post of another wafer.

4. The AESA tile of claim 1, wherein the beam former comprises at least one of a phase shifter, an amplifier or an application-specific integrated circuit (ASIC).

5. The AESA tile of claim 1, wherein the beam former is fabricated on silicon germanium (SiGe) wafer.

6. The AESA tile of claim 1, wherein the radiator structure provides radiation shielding for the beam former.

7. The AESA tile of claim 1, wherein the RF manifold propagates RF signals and no DC signals.

8. The AESA tile of claim 1, wherein the beam former includes a redistribution layer to allow for surface mounting to a printed circuit board.

9. The AESA tile of claim 1, wherein power, signal and RF are routed from the PWB through the beam former by a wafer via.

10. The AESA tile of claim 1, where the oxide-bonded semiconductor wafers are made of high resistivity silicon.

11. The AESA tile of claim 1 where the RF signal is routed using at least one of a stripline, a coplanar waveguide (CPW), a buried microstrip and a coaxial RF structure.

12. The AESA tile of claim 1, wherein the tile comprises time delay structures and filtering structures.

13. The AESA tile of claim 1, further comprising active elements,
    wherein active element spacing fits within Lambda/2 to enable wide scan to 60 degrees.

14. The AESA tile of claim 13, wherein the number of active elements between sixteen to sixty-four active elements.

15. The AESA tile of claim 13, wherein the tiles are scalable to an N×N array of active elements where N>1.

16. The AESA tile of claim 1 further comprising one or more time delay structures having a trace length selected to achieve a certain time delay.

17. The AESA tile of claim 1 further comprising a cooling plate that is positioned to cool the beamformer.

18. The AESA tile of claim 1 wherein the oxide-bonded semiconductor wafers are a stack of oxide-bonded wafers that are interconnected using RF direct bond hybridization (RF-DBH) and wafer vias.

19. The AESA tile of claim 1 wherein the fifth portion of the RF signal moves in the Y-axis direction in the RF manifold.

* * * * *